US006033281A

United States Patent [19]

Toro-Lira

[11] Patent Number: 6,033,281

[45] Date of Patent: Mar. 7, 2000

[54] SYSTEM FOR TESTING FIELD EMISSION FLAT PANEL DISPLAYS

[76] Inventor: Guillermo L. Toro-Lira, 1180 Reed Ave., Apt. 58, Sunnyvale, Calif. 94086

[21] Appl. No.: 09/060,112

[22] Filed: Apr. 15, 1998

[51] Int. Cl.[7] .......... H01L 9/42

[52] U.S. Cl. .......... 445/63

[58] Field of Search .......... 445/3, 63

[56] References Cited

U.S. PATENT DOCUMENTS 5,730,634 3/1998 Seko .......... 445/3

*Primary Examiner*—Kenneth J. Ramsey

*Attorney, Agent, or Firm*—Burns Doane Swecker & Mathis L.L.P.

[57] ABSTRACT

A system for testing field effect flat panel displays (FEFPDs) disposes the FEFPD in a vacuum and measures electron stream emission from selectively activated pixels of the FEFPD. Selective activation is effected using a linear stage mechanism associated with each contact pad of the FEFPD. Each linear stage mechanism comprises an electrically conducting ball bearing which is rolled over the associated contact pad to thereby complete an electrical circuit between an activation signal source and the electrodes of the pixel under test.

14 Claims, 3 Drawing Sheets

SYSTEM FOR TESTING FIELD EMISSION FLAT PANEL DISPLAYS

BACKGROUND OF THE INVENTION

1. Field of the Invention

The invention relates to testing systems, and more particularly, to a testing system for Field Emission Flat Panel Display (FEFPD) devices.

2. Description of Related Art

Flat panel displays, and specifically Field Emission Flat Panel Displays (FEFPDs), are technologically viable alternatives to cathode ray tubes (CRTs) for display of electronic information. They provide several advantages over CRTs, including smaller weight and size and lower power consumption. However, some manufacturing problems, such as the capability to test their expected performance, often make them more expensive than typical CRTs.

FIG. 1 shows a magnified cross-section schematic of a typical FEFPD 20. A substrate 11 is manufactured with several microscopic conical structures or Field Emitter (FE) cathodes 13. An electrode gate layer 15 confronts the substrate 11 and is provided with holes 17 just at the tip of the FE cathodes 13. The gate layer 15 is biased to a relatively high voltage (on the order of a few hundred of volts), causing the field emission and acceleration of electrons 19 located at the tip of the FE cathodes 13. The cathodes 13 are also biased to a positive voltage to control the amount of electrons emitted once the gate layer 15 enables their flow. Electrons 19 impact the inner surface 21 of a phosphorous-coated plate 23. Plate 23 is disposed in close proximity to gate layer 15, while the region between the substrate 11 and plate 23 is held under vacuum conditions to facilitate the emission process.

The impact of electrons 19 on the phosphorous-coated plate 23 causes photon emission at the outer surface 25 of plate 23, as indicated by arrows 27. By modulating an arrangement of row and column of FE pixels, a controlled light image can be generated.

FIG. 2 shows schematically the pixel arrangement of FEFPD 20. The panel is divided into a set of columns 31 and rows 33. One of these sets electrically comprises the FE cathode substrate while the other set comprises the FE gates. Pixels 39 are selectively activated by applying a voltage to the row and column intersection via a set of column and row drivers (35 and 37, respectively). Each pixel 39 contains more than one FE cathode, and a typical pixel arrangement contains an array of about 10×10 cathodes electrically connected in parallel. This redundant amount of cathode emitters increases the probability that the pixel display performance will be acceptable even with a few of the cathodes not operating properly. One of the purposes of this invention is to assess the amount of FEs that are operative for each pixel 39 by measuring the emission uniformity of all the pixels of the display.

It is recognized that for replacing CRTs in consumer applications such as TVs and computers, FEFPD manufacturing costs, which include costs of inspection during the manufacturing process to insure quality control and a functional product, must be reduced.

SUMMARY OF THE INVENTION

The invention overcomes the deficiencies of the prior art by providing an inspection system for field effect flat panel displays (FEFPDs) which activates the pixels of the flat panel display to emit electron current streams for measurement by a detector. The FEFPD is disposed in a vacuum and is scanned to sequentially activate the pixels thereof.

In a preferred embodiment of the invention, scanning is effected by an activation mechanism comprising a pair of selective activation linear stage mechanisms disposed in the vacuum chamber, which also houses the FEFPD. The linear stage mechanisms each comprise a sliding assembly guided by a rail and drive assembly. Motion is induced by a drive means which comprises either a manual dial or an appropriate motor. Each sliding assembly is provide with a ball bearing rotatably mounted therein, the ball bearing being urged toward contacts comprising the contact pads of the FEFPD to thereby complete an electrical circuit between an activation signal source and the contacts, which are each in connection with electrodes of the pixels of the FEFPD.

In another embodiment, the invention comprises a selective activation device comprising a stage mechanism which guides the motion of a sliding assembly. A ball bearing is rotatably mounted on the sliding assembly. The ball bearing is electrically conducting and is connected to an activation source. By rolling across the contact pads of an FEFPD and sequentially contacting electrically discrete portions thereof, the ball bearing selectively activates electrodes of the FEFPD.

One advantage provided by the arrangement of the invention is that testing of the active substrate array before the panel is completed provides manufacturing cost savings because scrap material due to defective active substrates can be detected before all the manufacturing expense is incurred.

BRIEF DESCRIPTION OF THE DRAWINGS

Many advantages of the present invention will be apparent to those skilled in the art with a reading of this specification in conjunction with the attached drawings, wherein like reference numerals are applied to like elements and wherein.

DESCRIPTION OF THE PREFERRED EMBODIMENTS

The present invention is used to test the uniformity of emission of the active substrate section of an FEFPD before panel manufacture is complete. The test is performed in a controlled vacuum environment.

Figure 1:
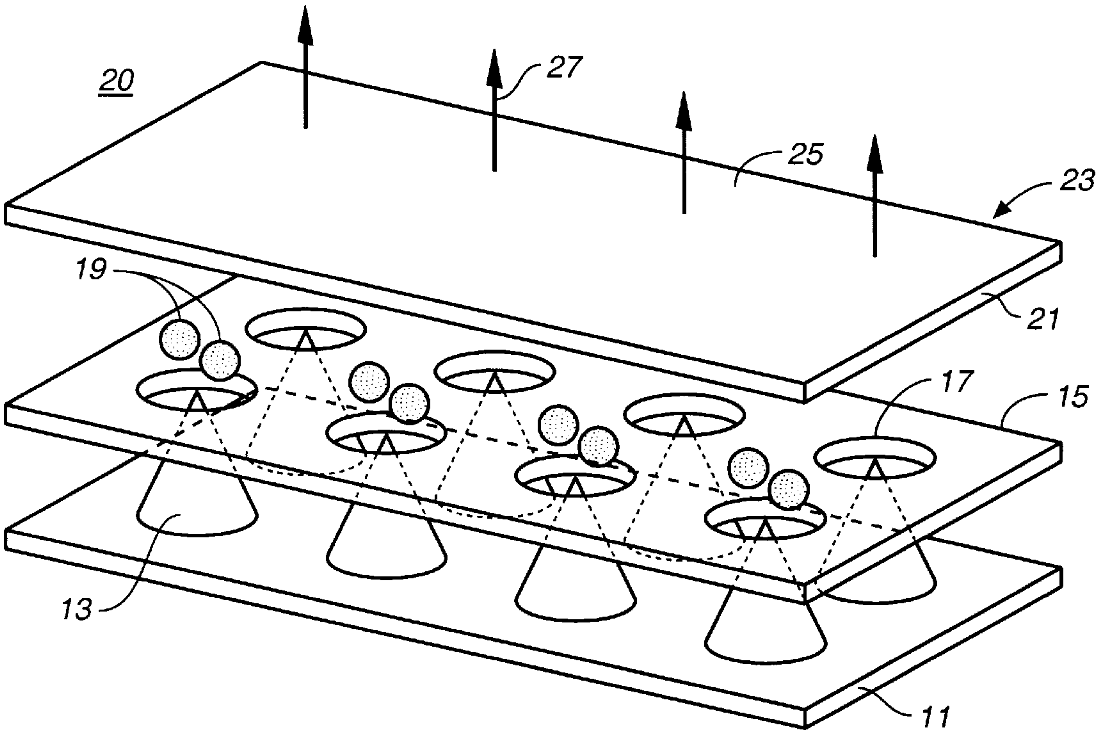
FIG. 1 is a perspective schematic view a pixel of a field effect flat panel display (FEFPD)
Figure 2:
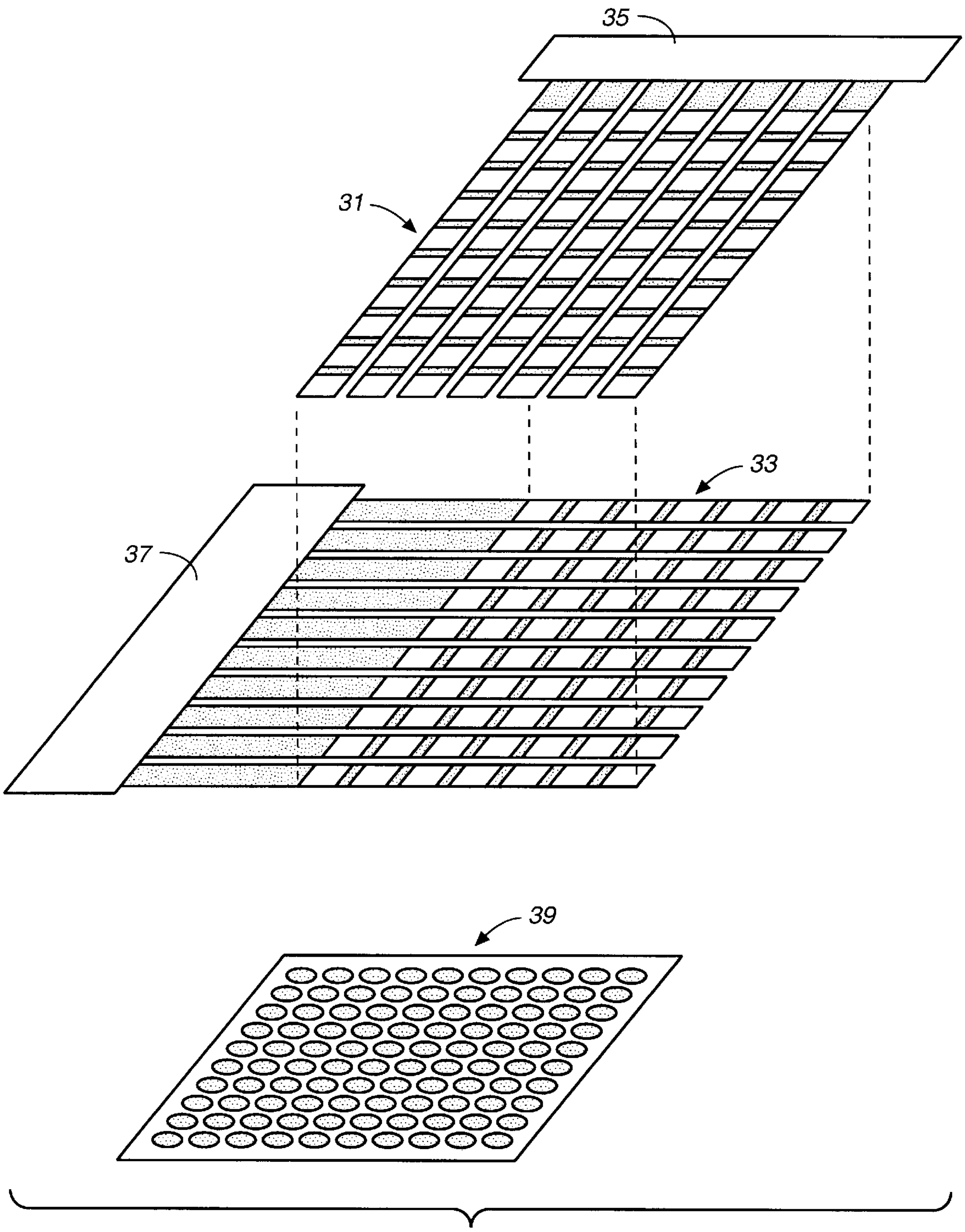
FIG. 2 is a schematic view of a pixel arrangement of an FEFPD of FIG. 1.
Figure 3:
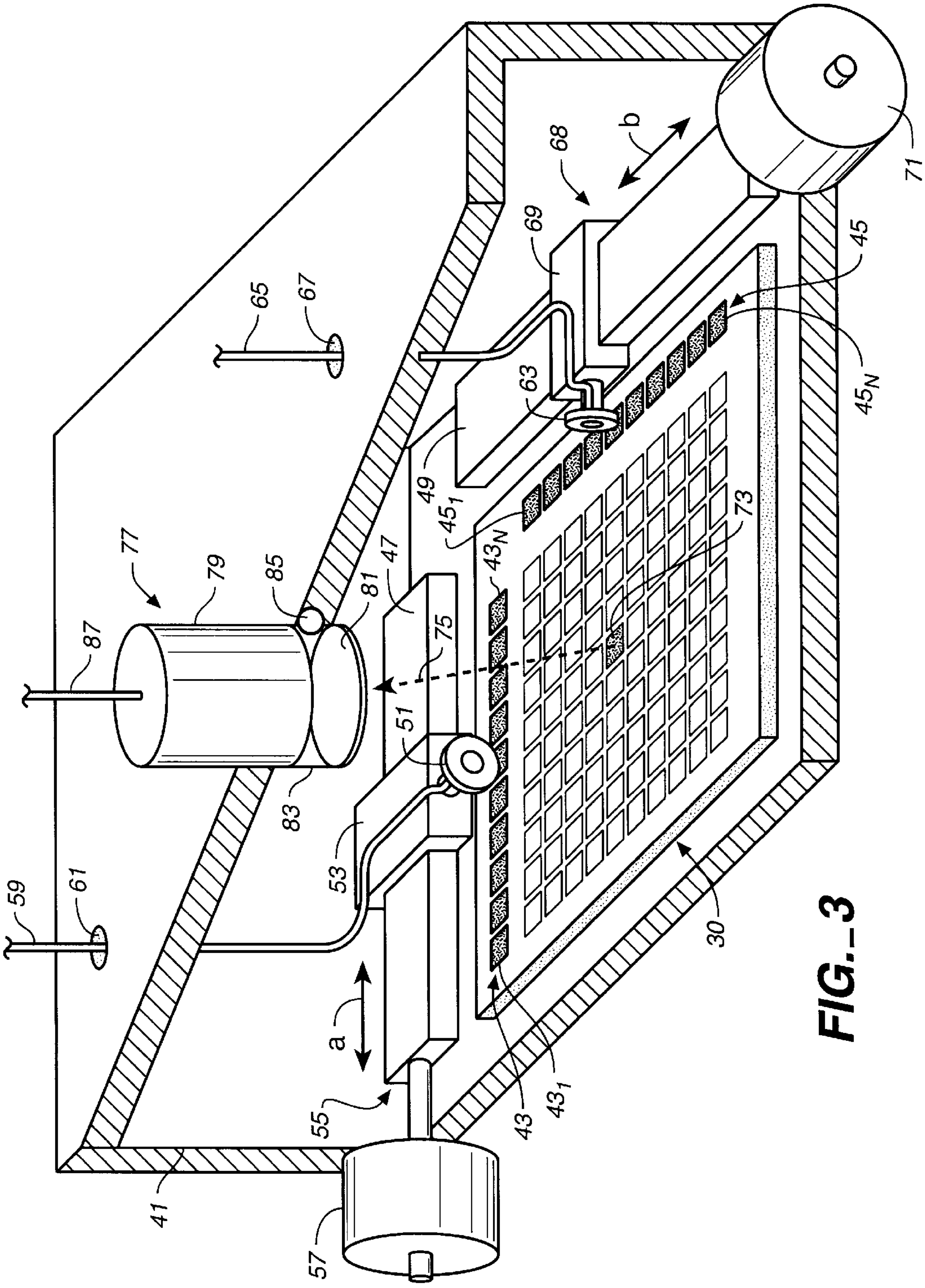
FIG. 3 is a schematic perspective view of an FEFPD testing device in accordance with the preferred embodiment of the invention.

FIG. 3 shows a three-dimensional schematic of an arrangement for testing an FEFPD in accordance with the invention. An FEFPD substrate 30 is shown placed inside a high vacuum chamber 41. For simplicity, only a section of the chamber 41 enclosure is shown. The FEFPD 30 comprises pixel column 43 and row 45 row contact pads 43 and 45, respectively, each comprising a plurality of individually addressable contacts $\mathbf{43}_{1\text{-}N}$, $\mathbf{45}_{1\text{-}N}$.

In accordance with the invention, pixels of the FEFPD 30 are selectively activated for testing. This is accomplished in the preferred embodiment by using a selective activation device comprising a pair of linear stage mechanisms 47 and 49 each associated with a corresponding contact pad of the FEFPD 30. Column contacts $\mathbf{43}_{1\text{-}N}$ are contacted by a ball bearing 51 that rolls over the contacts in the direction shown by arrow a. The rolling action is achieved using linear stage mechanism 55 shown schematically as comprising sliding assembly 53, rail and drive assembly 47, and drive source 57 comprising for instance a manual dial or a motor assembly preferably located outside the vacuum chamber 41. An appropriate mechanical linkage (not shown) translates rotary motion of drive source 57 to linear motion of sliding assembly 53. For simplicity, the vacuum chamber feedthrough of the drive source 57 is not shown. Ball bearing 51 is rotatably mounted in sliding assembly 53 and is electrically isolated from the linear stage mechanism 55 while being in electrical communication with the exterior of vacuum chamber 41 via conductor 59 passing through a conductor feedthrough 61. The electrical signal necessary to activate the columns of the FEFPD 30 is conducted into the vacuum chamber via this electrical connection and may be provided by an appropriate activation source (not shown).

The rows of the FEFPD 30 are activated using row contact pad ball bearing 63 electrically connected to the exterior of vacuum chamber 41 via conductor 65 passing through feed through 67. It should be noted that the system in accordance with the invention can be configured such that conductors 59 and 65 share a common feedthrough. Ball bearing 63 is rolled over contacts $\mathbf{45}_{1\text{-}N}$ of row contact pad 45 in the direction indicated by arrow b using linear stage mechanism 68, which comprises sliding assembly 69, rail and drive assembly 49 and a drive source 71. The vacuum chamber feedthrough of drive source 71, which may comprise a motor or a manual dial mechanism, is not shown for simplicity.

Row and column contact pad ball bearings 51 and 63 are configured to be minimally biased against their corresponding contact pads such that reliable electrical contact between the ball bearings 51 and 63 and the respective contacts $\mathbf{43}_{1\text{-}N}$ and $\mathbf{45}_{1\text{-}N}$ is achieved without damaging the substrate of the FEFPD 30. A spring biasing mechanism (not shown) or other means of urging electrical contact is contemplated. Also, ball bearings 51 and 63 are subject to low rotational friction and designed with a diameter which is of an appropriate relation to the distance between contacts $\mathbf{43}_{1\text{-}N}$ and $\mathbf{45}_{1\text{-}N}$ such that only one contact at a time is electrically contacted by each ball bearing. In this manner any pixel of FEFPD 30 can be individually addressed, with the rolling motion of ball bearings 51 and 63 in the respective a and b directions across contact pads 43 and 45 causing the sequential activation of the addressed pixels of FEFPD 30. The activation signal is provided by an activation signal source (not shown) controlled by a control device (not shown) which correlates the position of the ball bearings 51 and 63, and thus the identity of the particular pixel under test, with the output signal of the detector 77 to thereby provide an indication of the condition of the pixel array. The process may be further automated by provision of a comparison expedient between the detected signal from detector 77 and a standard signal representative of a defect-free pixel.

Although in the preferred embodiment ball bearings are used as rolling members to electrically contact the contacts $\mathbf{43}_{1\text{-}N}$, $\mathbf{45}_{1\text{-}N}$, those skilled in the art will recognize that any circular rotating object, taking the form of a wheel for instance, can be substituted therefor. Similarly, any pointing stylus that slides across the contacts 43 and 45 can also be used, with the rolling action being dispensed with altogether.

By individually contacting contacts $\mathbf{43}_{1\text{-}N}$ and $\mathbf{45}_{1\text{-}N}$, selective addressing of the array of pixels of FEFPD 30 is achieved. The pixels can thus be activated for testing their performance during the manufacturing process. In FIG. 3, the row and column contact pad ball bearings 51 and 63 are shown activating the gate and FE cathode electrodes of pixel 73. Thus activated, pixel 73, referred to as the pixel under test, emits an electronic current stream 75 towards detector 77, which is preferably an Everhart-Thornel type-high sensitivity electron detector. The electron detector 77 is provided with a detection region comprising a scintillator disk 81 that is biased to a voltage which is on the order of 10 KV. This voltage generates a high acceleration field inside the chamber 41 that attracts electrons emitted by any of the addressed pixels of FEFPD 30. The scintillator disc 81 operates to convert the electron impacts thereon to photons which are directed to photomultiplier tube (PMT) 79 via a light pipe 83. Light pipe 83 also acts as a feedthrough from the PMT 79 into the vacuum chamber 41, relying on a circular O-ring 85 to maintain hermetical sealing of the interior of the vacuum chamber. PMT 79 converts the photon emission stimulated in scintillator disk 81 by electronic current stream 75 into an electrical signal which is transferred to appropriate measuring and analysis equipment (not shown) via electrical conductor 87. The measuring and analysis equipment will operate to correlate the position of the particular pixel under test with the output signal 77 by for instance tracking the position of the row and column contact ball bearings 51 and 63 and comparing the signal generated by the pixel associated with these positions with a standard signal indicative of a properly functioning pixel. The electrical output signal of the detector 77 will vary in direct proportion to the magnitude of the emitted electronic current stream of the addressed pixel. In this manner, pixel performance can be assessed. Sequential scanning of each pixel of the FEFPD 30 can be used to generate uniformity data across the whole FEFPD 30. This process can be automated by having a computer system control drive sources 57 and 71 in synchrony with the reading the output of electron detector 77 using an analog to digital converter and other electronic expedients.

The above are exemplary modes of carrying out the invention and are not intended to be limiting. It will be apparent to those skilled in the art that modifications thereto can be made without departure from the spirit and scope of the invention as set forth in the following claims.

I claim:

1. A testing device for testing a field emission flat panel display (FEFPD) during manufacture, the FEFPD having an array of selectively addressable pixels each adapted to emit an electronic current stream in response to an applied activation signal, the testing device comprising:

an activation signal source;

a vacuum chamber adapted to contain the electronic current stream of each activated pixel within a vacuum environment;

an activation mechanism for individually applying the activation signal from the activation signal source to the pixels of the FEFPD; and a detector for detecting an emitted electronic current stream from the pixels and for generating an output signal representative of the emitted electronic current stream, wherein the detector is an electron detector adapted to generate an acceleration field for attracting electrons of the electronic current stream to the detector and comprises:

a scintillator screen for generating photon emission in response to impingement of electrons from the electronic current screen;

a photomultiplier tube for generating the output signal in proportion to the photon emission; and a light guide for conveying the photon emission from the scintillator screen to the photomultiplier tube, the light guide operating as a vacuum-tight feedthrough between exterior and interior portions of the vacuum chamber.

2. A testing device for testing a field emission flat panel display (FEFPD) during manufacture, the FEFPD having an array of selectively addressable pixels each adapted to emit an electronic current stream in response to an applied activation signal, the testing device comprising:

an activation signal source;

a vacuum chamber adapted to contain the electronic current stream of each activated pixel within a vacuum environment;

an activation mechanism for individually applying the activation signal from the activation signal source to the pixels of the FEFPD; and a detector for detecting an emitted electronic current stream from the pixels and for generating an output signal representative of the emitted electronic current stream, wherein the activation mechanism comprises a selective activation device for individually connecting electrodes of the pixel array to the activation signal source, the electrodes being in electrical connection with corresponding electrically distinct portions of at least one contact pad, each contact pad being disposed along an associated contact pad path, the selective activation device comprising:

at least one translating mechanism associated with one contact pad and adapted to travel along the contact pad path, the translating mechanism comprising an electrically conductive material adapted to sequentially complete an electrical circuit between each electrically distinct portion of the associated contact pad and the activation signal source; and a drive source for motivating travel of the translating mechanism along the contact pad path.

3. The selective activation device of claim 2, wherein the translating mechanism is circular in shape and is adapted to rotate along the contact pad path to thereby complete the electrical circuit with only one electrically distinct portion at a time.

4. A selective activation device for individually connecting electrodes of a pixel array to an activation signal source, the electrodes being in electrical connection with corresponding electrically distinct portions of at least one contact pad, each contact pad being disposed along an associated contact pad path, the selective activation device comprising:

at least one translating mechanism associated with one contact pad and adapted to travel along the contact pad path, the translating mechanism comprising an electrically conductive material adapted to sequentially complete an electrical circuit between each electrically distinct portion of the associated contact pad and the activation signal source; and a drive source for motivating travel of the translating mechanism along the contact pad path.

5. The selective activation device of claim 4, wherein the translating mechanism is circular in shape and is adapted to rotate along the contact pad path to thereby complete the electrical circuit with only one electrically distinct portion at a time.

6. The selective activation device of claim 4, wherein the contact pad is one of a pair of row and column contact pads of an FEFPD.

7. A testing device for testing FEFPD pixels during manufacture, the pixels being arranged in an ordered array and being selectively electrically addressable from corresponding column and row electrodes disposed respectively along column and row contact pads each extending along a contact pad direction, the testing device comprising:

an activation signal source;

a vacuum chamber;

a pair of linear stage mechanisms each associated with a corresponding one of the column and row contact pads, the linear stage mechanisms each adapted to individually apply an activation signal from the activation signal source to a corresponding electrode of a selected pixel under test, the pair of linear stage mechanisms being disposed in the vacuum chamber and comprising:

a rail and drive assembly;

a sliding assembly slidably mounted on the rail and drive assembly and adapted to translate in a direction parallel to the contact pad direction;

a ball bearing rotatably mounted in the sliding assembly, the ball bearing having an electrically conducting portion which is in electrical communication with the activation source, the ball bearing being adapted to roll along the contact pad direction and being urged to sequentially make electrical contact with the corresponding electrode of the pixel under test to thereby complete an electrical path between the activation source and the corresponding electrode of the pixel under test; and a detector of detecting electronic current stream emission from the pixel under test in response to the applied activation signal.

8. The testing device of claim 7, wherein each linear stage mechanism is provided with a drive source for motivating rolling of the ball bearings, the drive source being disposed outside the vacuum chamber and being mechanically linked to the associated linear stage mechanism through a vacuum-tight feedthrough.

9. The testing device of claim 8, wherein the drive source comprises a manual dial.

10. The testing device of claim 8, wherein the drive source is a motor operating in synchrony with the detector.

11. The testing device of claim 7, wherein the detector is an electron detector comprising:

a scintillator screen for generating photon emission in response to impingement of electrons from the electronic current screen;

a photomultiplier tube for generating an output signal in proportion to the photon emission; and a light guide for conveying the photon emission from the scintillator screen to the photomultiplier tube, the light guide operating as a vacuum-tight feedthrough between exterior and interior portions of the vacuum chamber.

12. A method of testing a field effect flat panel display (FEFPD) having an array of pixels, the method comprising:

selecting, as a pixel under test, a predetermined pixel from the array of pixels;

disposing the pixel under test in a vacuum;

activating the pixel under test with an activation signal;

detecting electron current stream emission from the pixel under test;

generating an output signal representative of the detected electron current stream; and analyzing the output signal to thereby determine the condition of the FEFPD wherein the step of selecting comprises rolling at least one rolling member over a contact pad associated with the rolling member, each contact pad comprising a set of one or more electrically discrete contacts, the electrically discrete contacts each being in electrical connection with an electrode of an associated pixel of the FEFPD, the rolling member thereby completing an electrical circuit path for provision of the activation signal to the associated pixel.

13. The method of claim 12, wherein the step of detecting comprises:

generating an acceleration field for attracting electrons of the electron current stream;

generating photon emission from the electron stream; and generating the output signal from the photon emission.

14. The method of claim 12, wherein the step of analyzing comprises:

correlating the output signal with the position of each rolling member along the contact pad associated therewith to thereby provide a pixel under test condition signal; and comparing the pixel under test condition signal with a predetermined standard value.

* * * * *